(12) United States Patent
Annamalai et al.

(10) Patent No.: US 9,382,150 B2
(45) Date of Patent: Jul. 5, 2016

(54) BORON-DOPED TITANIA-SILICA GLASS HAVING VERY LOW CTE SLOPE

(71) Applicant: Corning Incorporated, Corning, NY (US)

(72) Inventors: Sezhian Annamalai, Painted Post, NY (US); Carlos Alberto Duran, Ottawa (CA); Kenneth Edward Hrdina, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/637,516

(22) Filed: Mar. 4, 2015

(65) Prior Publication Data

US 2015/0259239 A1 Sep. 17, 2015

Related U.S. Application Data

(60) Provisional application No. 61/952,936, filed on Mar. 14, 2014.

(51) Int. Cl.
*C03C 3/06* (2006.01)
*C03C 3/089* (2006.01)
(Continued)

(52) U.S. Cl.
CPC . *C03C 3/06* (2013.01); *C03B 25/02* (2013.01); *C03C 3/089* (2013.01); *C03C 3/091* (2013.01);
(Continued)

(58) Field of Classification Search
CPC ............ C03C 2201/06; C03C 2201/08; C03C 2201/42; C03C 3/06
USPC .......................................................... 501/54
See application file for complete search history.

(56) References Cited

U.S. PATENT DOCUMENTS 4,337,295 A 6/1982 Rittler
8,012,653 B2 9/2011 Koike et al.
(Continued)

FOREIGN PATENT DOCUMENTS

BE 682846 12/1966
DE 10349648 5/2005
(Continued)

OTHER PUBLICATIONS

Kliment'eva et al. A Study of the Aluminum'Chromium Phosphate Binder Based on the Slurry (Slime) Orthophosphoric Acid. V. A. Kucherenko Central Scientific-Research Institute TsNIISK. Translated from Ogneupory, No. 8, pp. 26-31, Aug. 1986.*
(Continued)

*Primary Examiner* — Noah Wiese
(74) *Attorney, Agent, or Firm* — Kevin L. Bray

(57) ABSTRACT

A boron-doped titania-silica glass containing 0.1 wt % to 8.0 wt % boron, 9.0 wt % to 16.0 wt % $TiO_2$, and 76.0 wt % to 90.9 wt % $SiO_2$. The glass may further include F, Nb, Ta, Al, Li, Na, K, Ca, and Mg, individually or in combinations of two or more, at levels up to 4 wt %. The glass may have an OH concentration of more than 10 ppm. The glass features a CTE slope at 20° C. of less than 1 ppb/$K^2$. The fictive temperature of the glass is less than 825° C. and the peak CTE of the glass is less than 30 ppb/K. The glass has two crossover temperatures and a wide temperature interval over which CTE is close to zero. The uniformity of each crossover temperature relative to its average over a volume of at least 50 $cm^3$ is within ±5° C.

20 Claims, 6 Drawing Sheets

(51) Int. Cl.
*C03C 3/115* (2006.01)
*C03C 3/097* (2006.01)
*C03C 3/091* (2006.01)
*C03B 25/02* (2006.01)

(52) U.S. Cl.
CPC ............... *C03C 3/097* (2013.01); *C03C 3/115* (2013.01); *C03C 2201/10* (2013.01); *C03C 2201/42* (2013.01); *C03C 2203/40* (2013.01); *C03C 2203/52* (2013.01)

(56) References Cited

U.S. PATENT DOCUMENTS

2010/0028787 A1* 2/2010 Koike .................... B82Y 10/00
430/5

2012/0238434 A1* 9/2012 Koike .................. C03B 19/1453
501/54

FOREIGN PATENT DOCUMENTS

| | | |
|---|---|---|
| DE | 102004060600 | 7/2005 |
| EP | 2003098 | 12/2008 |
| EP | 2468692 | 6/2012 |
| EP | 2518030 | 10/2012 |
| WO | 02/088036 | 11/2002 |
| WO | 2009128560 | 10/2009 |
| WO | 2011068064 | 6/2011 |
| WO | 2014085529 | 6/2014 |

OTHER PUBLICATIONS

PCT/US2015/020065—Search Report.

* cited by examiner

US 9,382,150 B2

BORON-DOPED TITANIA-SILICA GLASS HAVING VERY LOW CTE SLOPE

This application claims the benefit of priority under 35 U.S.C. §119 of U.S. Provisional Application Ser. No. 61/952,936 filed on Mar. 14, 2014 the content of which is relied upon and incorporated herein by reference in its entirety.

FIELD

This disclosure relates to a titania-silica glass doped with boron and methods for making the glass. The glass features very low CTE slope and is well suited for use as a blank for photomasks or mirrors in optical systems for EUV lithography.

BACKGROUND

Extreme Ultra-Violet Lithography (EUVL) is emerging as the leading lithography technology at the 22 nm node and beyond for the manufacture of MPU/DRAM chips [MPU—Micro Processing Unit, and DRAM—Dynamic Random Access Memory). EUVL scanners capable of fabricating chips at the 22 nm node have been demonstrated in small scale production and are currently being developed for manufacturing on a larger scale. Optics, particularly reflective optics, are an important component of EUVL scanners. Low thermal expansion glass, for example ULE® glass (Corning Incorporated), is currently being used as substrate for reflective optics in EUVL scanners. The major advantages of ULE® Glass include excellent polishability (to achieve smooth, defect-free surfaces), low CTE (coefficient of thermal expansion or expansivity), excellent spatial control of CTE, and dimensional stability. As the development of EUVL systems progresses and interest in ever smaller lithographic dimensions increases, however, the specifications for optical components are becoming increasingly more stringent. There is a need for new materials to meet the anticipated performance requirements for future EUVL optical systems.

SUMMARY

The present disclosure provides an improved glass for EUVL optical systems. The glass exhibits a low CTE slope. The expansivity (or CTE) slope of the glass is significantly lower than the expansivity slope of the conventional binary titania-silica glass ($TiO_2$—$SiO_2$) that is widely used in current EUVL optical systems. The glass of the present disclosure is a titania-silica glass that includes boron doping. The improvement in expansivity slope observed in the present boron-doped titania-silica glass exceeds the improvement possible for conventional titania-silica glasses through adjustment of the annealing cycle alone. Alternatively, a targeted reduction in expansivity slope can be obtained with the boron-doped titania-silica glass in fewer or faster annealing cycles than with conventional titania-silica glass. As a result, manufacturing cost and time are greatly reduced.

The improvement in expansivity slope of the present glass is accomplished via a combination of both compositional and structural changes. Compositionally, the glass is a titania-silica glass that includes a boron dopant. The glass may optionally include one or more of F, Nb, Ta, Al, Li, Na, K, Ca, and Mg. The glass may also include OH.

Structurally, the annealing cycle is controlled to yield a desired glass structure(s). It has been found that while annealing alone can provide a structural improvement in undoped titania-silica glass leading to an expansivity slope reduction of up to 40%, the inclusion of boron as a dopant, in an amount consistent with the present disclosure, provides for structural improvements that can lead to a CTE slope reduction in excess of 50%. Additionally, the annealing cycle is controlled to provide a boron-doped titania-silica glass with a highly uniform spatial distribution of fictive temperature (TO and zero crossover temperature ($T_{ZC}$) in the glass.

The boron-doped titania-silica glass has two crossover temperatures ($T_{ZC}$, temperature at which the CTE of the glass is zero) within the typical operational temperature range for optics in EUV lithography (including processes using 13.5 nm radiation).

Preparation of the boron-doped titania-silica glass is not limited to a particular process. The glass can be made by many preparation techniques including, but not limited to, sol-gel, soot blank, soot pressing, pyrolysis, outside vapor deposition, axial vapor deposition, the direct process, the indirect process, plasma process, chemical vapor deposition, and other processes known in the art. Boron doping can be accomplished in many ways, such as by adding a boron precursor to a sol-gel slurry before gelation or spray drying, during laydown in an OVD/AVD process or the direct process or by providing a boron precursor during consolidation.

The boron-doped titania-silica glass can be used to make photomask blanks and substrates for mirrors or other optical components. The glass can also be configured as smaller blanks, which can then be used to form the critical zone of a mirror blank of a projection optics system in a EUVL stepper.

Embodiments of the boron-doped titania-silica glass include:

A glass comprising 0.1 wt % to 8 wt % $B_2O_3$, 9 wt % to 16 wt % $TiO_2$, and 76 wt % to 90.9 wt % $SiO_2$, said glass having an expansivity slope at 20° C. less than 1 $ppb/K^2$.

Embodiments of the boron-doped titania-silica glass include:

A glass consisting essentially of 0.1 wt % to 8 wt % $B_2O_3$, 9 wt % to 16 wt % $TiO_2$, and the remainder $SiO_2$, said glass having an expansivity slope at 20° C. less than 1 $ppb/K^2$.

Embodiments of the boron-doped titania-silica glass include:

A glass consisting essentially of 0.1 wt % to 8 wt % $B_2O_3$, 9 wt % to 16 wt % $TiO_2$, 10 ppm to 2000 ppm OH, and the remainder $SiO_2$, said glass having an expansivity slope at 20° C. less than 1 $ppb/K^2$.

Embodiments of methods of making a boron-doped titania-silica glass include:

A method for making a boron-doped titania-silica glass comprising:
preparing a composition by combining titania-silica soot with a boron precursor, the titania-silica soot including 9 wt %-16 wt % $TiO_2$ and 78 wt %-91 wt % $SiO_2$;
consolidating said composition at a temperature of at least 1300° C. to form a consolidated composition, said consolidated composition including 0.1 wt % to 8 wt % $B_2O_3$;
annealing said consolidated composition at an annealing temperature of at least 850° C. for at least one hour to form an annealed consolidated composition; and
cooling said annealed consolidated composition from said annealing temperature at a rate between 0.1° C./hr and 30° C./hr to a temperature below 750° C.

DETAILED DESCRIPTION

Figure 1:
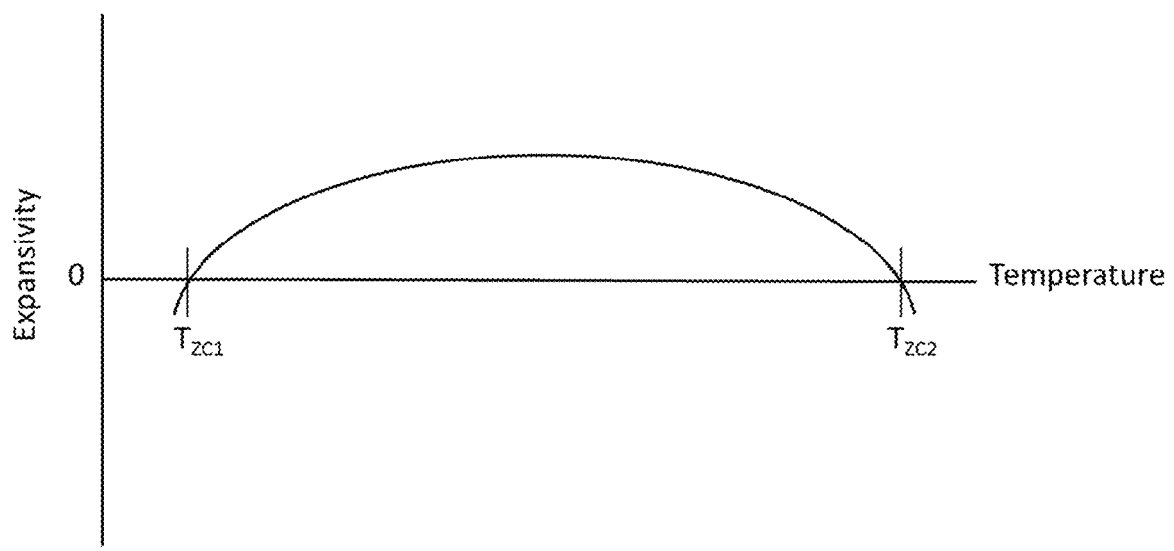
FIG. 1 is a schematic depiction of expansivity (CTE) as a function of temperature for a typical titania-silica or doped titania-silica glass.

Titania-silica glass with low CTE (coefficient of thermal expansion; also referred to herein as expansivity) and low CTE slope (slope of the functional dependence of CTE on temperature, also referred to herein as expansivity slope) is an important requirement for blanks (substrates) for mirrors in projection optics and photomasks for EUVL steppers. Blanks with reduced CTE slope provide improved thermal and dimensional stability, and will enable use of higher power sources in EUVL systems and will lead to much higher productivity in EUVL processing.

The illustrated embodiments provide doped titania-silica glasses that feature low CTE slope and high spatial uniformity of fictive temperature ($T_f$), CTE, CTE slope, and crossover temperature ($T_{ZC}$). The doped titania-silica glasses are excellent substrate materials for mirrors, other optics and photomasks in EUVL processing systems and in other applications where superior thermal and dimensional stability is required. In addition, the doped titania-silica glass can be configured in smaller volumes and used as an insert in the critical zone of a mirror blank for projection optics. Mirrors used in projection optics can have a diameter in the range of 10 cm to 60 cm, and may become even larger in the future. The overall cost of the mirror can be reduced by identifying the critical zone of the mirror substrate and limiting use of more specialized low CTE materials to the limited portion of the substrate that is critical to performance. The balance of the substrate can remain as conventional titania-silica glass. The use of inserts in the critical zone of EUVL systems elements is disclosed in commonly owned U.S. Patent Application Publication Nos. 20130047669A1 and 20130052391A1.

The improvement in performance of the present glass is accomplished via a combination of both compositional and structural changes. Compositionally, the glass is a titania-silica glass that includes boron. Boron may be referred to herein as a dopant. The glass may be referred to herein as a boron-doped glass or boron-doped titania-silica glass. The boron may be incorporated in the titania-silica glass in the form of $B_2O_3$ and/or the boron may be incorporated in the titania-silica glass in one or more forms other than $B_2O_3$. Unless otherwise stated, references to boron concentration or boron dopant concentration are understood, for reasons of convention, to refer not to the concentration of elemental B, but rather to the $B_2O_3$ equivalent concentration associated with the known amount of B included in the composition. It is understood that the boron concentrations reported herein do not necessarily imply that all boron is incorporated as $B_2O_3$. Instead, the structural incorporation of boron may be diverse and include forms of incorporation other than $B_2O_3$.

In one embodiment, the boron concentration is selected to provide low CTE slope. In another embodiment, the boron concentration is selected to provide low CTE. For a given boron concentration, the $TiO_2$ and/or $SiO_2$ content is selected to optimize CTE slope or CTE to provide a glass with low or minimum CTE slope or low or minimum CTE over a wide temperature range.

In one embodiment, the glass contains 0.1 wt % to 8.0 wt % $B_2O_3$, 9.0 wt % to 16.0 wt % $TiO_2$, and 76.0 wt % to 90.9 wt % $SiO_2$. In another embodiment, the glass contains 1.0 wt % to 7.0 wt % $B_2O_3$, 9.0 wt % to 16.0 wt % $TiO_2$, and 77.0 wt % to 90.0 wt % $SiO_2$. In another embodiment, the glass contains 2.0 wt % to 7.0 wt % $B_2O_3$, 9.0 wt % to 16.0 wt % $TiO_2$, and 77.0 wt % to 89.0 wt % $SiO_2$. In another embodiment, the glass contains 3.0 wt % to 7.0 wt % $B_2O_3$, 9.0 wt % to 16.0 wt % $TiO_2$, and 77.0 wt % to 88.0 wt % $SiO_2$. In another embodiment, the glass contains 4.0 wt % to 7.0 wt % $B_2O_3$, 9.0 wt % to 16.0 wt % $TiO_2$, and 77.0 wt % to 87.0 wt % $SiO_2$.

In one embodiment, the glass contains 0.1 wt % to 8.0 wt % $B_2O_3$, 10.0 wt % to 16.0 wt % $TiO_2$, and 76.0 wt % to 89.9 wt % $SiO_2$. In another embodiment, the glass contains 1 wt % to 7.0 wt % $B_2O_3$, 10.0 wt % to 16.0 wt % $TiO_2$, and 77.0 wt % to 89.0 wt % $SiO_2$. In another embodiment, the glass contains 2.0 wt % to 7.0 wt % $B_2O_3$, 10.0 wt % to 16.0 wt % $TiO_2$, and 77.0 wt % to 88.0 wt % $SiO_2$. In another embodiment, the glass contains 3.0 wt % to 7.0 wt % $B_2O_3$, 10.0 wt % to 16.0 wt % $TiO_2$, and 77.0 wt % to 87.0 wt % $SiO_2$. In another embodiment, the glass contains 4.0 wt % to 7.0 wt % $B_2O_3$, 10.0 wt % to 16.0 wt % $TiO_2$, and 77.0 wt % to 86.0 wt % $SiO_2$.

In one embodiment, the glass contains 0.1 wt % to 8.0 wt % $B_2O_3$, 11 wt % to 16.0 wt % $TiO_2$, and 76.0 wt % to 88.9 wt % $SiO_2$. In another embodiment, the glass contains 1.0 wt % to 7.0 wt % $B_2O_3$, 11.0 wt % to 16.0 wt % $TiO_2$, and 77.0 wt % to 88.0 wt % $SiO_2$. In another embodiment, the glass contains 2.0 wt % to 7.0 wt % $B_2O_3$, 11.0 wt % to 16.0 wt % $TiO_2$, and 77.0 wt % to 87.0 wt % $SiO_2$. In another embodiment, the glass contains 3.0 wt % to 7.0 wt % $B_2O_3$, 11.0 wt % to 16.0 wt % $TiO_2$, and 77.0 wt % to 86.0 wt % $SiO_2$. In another embodiment, the glass contains 4.0 wt % to 7.0 wt % $B_2O_3$, 11.0 wt % to 16.0 wt % $TiO_2$, and 77.0 wt % to 85.0 wt % $SiO_2$.

The glass may optionally include one or more of F, Nb, Ta, Al, Li, Na, K, Ca, and Mg. When referring to the concentration of Nb, Ta, Al, Li, Na, K, Mg, or Ca it is understood that concentration refers to the oxide form (e.g. $Nb_2O_5$, $Ta_2O_5$, $Al_2O_3$, $Li_2O$, $Na_2O$, $K_2O$, MgO, CaO) instead of the elemental form, irrespective of the mode of structural incorporation. In one embodiment, the glass includes up to 0.4 wt % of one of F, $Nb_2O_5$, $Ta_2O_5$, $Al_2O_3$, $Li_2O$, $Na_2O$, $K_2O$, MgO, and CaO. In another embodiment, the glass includes up to 0.2 wt % of one of F, $Nb_2O_5$, $Ta_2O_5$, $Al_2O_3$, $Li_2O$, $Na_2O$, $K_2O$, MgO, and CaO. In still another embodiment, the glass includes up to 0.1 wt % of one of F, $Nb_2O_5$, $Ta_2O_5$, $Al_2O_3$, $Li_2O$, $Na_2O$, $K_2O$, MgO, and CaO. In one embodiment, the glass includes one of F, $Nb_2O_5$, $Ta_2O_5$, $Al_2O_3$, $Li_2O$, $Na_2O$, $K_2O$, MgO, and CaO at a concentration of 50 ppm-wt to 0.4 wt %. In another embodiment, the glass includes one of F, $Nb_2O_5$, $Ta_2O_5$, $Al_2O_3$, $Li_2O$, $Na_2O$, $K_2O$, MgO, and CaO at a concentration of 50 ppm-wt to 0.2 wt %. In still another embodiment, the glass includes one of F, $Nb_2O_5$, $Ta_2O_5$, $Al_2O_3$, $Li_2O$, $Na_2O$, $K_2O$, MgO, and CaO at a concentration of 50 ppm-wt to 0.1 wt %. In one embodiment, the glass includes two or more of F, $Nb_2O_5$, $Ta_2O_5$, $Al_2O_3$, $Li_2O$, $Na_2O$, $K_2O$, MgO, and CaO at a combined concentration of up to 0.4 wt %. In one embodiment, the glass includes two or more of F, $Nb_2O_5$, $Ta_2O_5$, $Al_2O_3$, $Li_2O$, $Na_2O$, $K_2O$, MgO, and CaO at a combined concentration of up to 0.2 wt %. In another embodiment, the glass includes two or more of F, $Nb_2O_5$, $Ta_2O_5$, $Al_2O_3$, $Li_2O$, $Na_2O$, $K_2O$, MgO, and CaO at a combined concentration of up to 0.1 wt %. In one embodiment, the glass includes two or more of F, $Nb_2O_5$, $Ta_2O_5$, $Al_2O_3$, $Li_2O$, $Na_2O$, $K_2O$, MgO, and CaO at a combined concentration of 50 ppm-wt to 0.4 wt %. In one embodiment, the glass includes two or more of F, $Nb_2O_5$, $Ta_2O_5$, $Al_2O_3$, $Li_2O$, $Na_2O$, $K_2O$, MgO, and CaO at a combined concentration of 50 ppm-wt to 0.2 wt %. In another embodiment, the glass includes two or more of F, $Nb_2O_5$, $Ta_2O_5$, $Al_2O_3$, $Li_2O$, $Na_2O$, $K_2O$, MgO, and CaO at a combined concentration of 50 ppm-wt to 0.1 wt %.

The glasses disclosed herein also include OH. In one embodiment, the OH concentration of the glass is at least 10 ppm. In one embodiment, the OH concentration of the glass is at least 50 ppm. In one embodiment, the OH concentration of the glass is at least 100 ppm. In another embodiment, the OH concentration of the glass is at least 300 ppm. In still another embodiment, the OH concentration of the glass is at least 600 ppm. In a further embodiment, the OH concentration of the glass is at least 800 ppm. In a further embodiment, the OH concentration of the glass is at least 1200 ppm. The OH concentration of the glass may be between 10 ppm and 2000 ppm, or between 100 ppm and 1500 ppm, or between 300 ppm and 1500 ppm, or between 600 ppm and 1500 ppm.

In one embodiment, the glass consists essentially of 0.1 wt % to 8.0 wt % $B_2O_3$, 9.0 wt % to 16.0 wt % $TiO_2$ and the remainder $SiO_2$. In another embodiment, the glass consists essentially of 0.5 wt % to 7.0 wt % $B_2O_3$, 9.0 wt % to 16.0 wt % $TiO_2$ and the remainder $SiO_2$. In still another embodiment, the glass consists essentially of 1.0 wt % to 7.0 wt % $B_2O_3$, 9.0 wt % to 16.0 wt % $TiO_2$ and the remainder $SiO_2$. In still another embodiment, the glass consists essentially of 2.0 wt % to 7.0 wt % $B_2O_3$, 9.0 wt % to 16.0 wt % $TiO_2$ and the remainder $SiO_2$. In still another embodiment, the glass consists essentially of 3.0 wt % to 7.0 wt % $B_2O_3$, 9.0 wt % to 16.0 wt % $TiO_2$ and the remainder $SiO_2$. In still another embodiment, the glass consists essentially of 4.0 wt % to 7.0 wt % $B_2O_3$, 9.0 wt % to 16.0 wt % $TiO_2$ and the remainder $SiO_2$.

In one embodiment, the glass consists essentially of 0.1 wt % to 8.0 wt % $B_2O_3$, 10.0 wt % to 16.0 wt % $TiO_2$ and the remainder $SiO_2$. In another embodiment, the glass consists essentially of 0.5 wt % to 7.0 wt % $B_2O_3$, 10.0 wt % to 16.0 wt % $TiO_2$ and the remainder $SiO_2$. In still another embodiment, the glass consists essentially of 1.0 wt % to 7.0 wt % $B_2O_3$, 10.0 wt % to 16.0 wt % $TiO_2$ and the remainder $SiO_2$. In still another embodiment, the glass consists essentially of 2.0 wt % to 7.0 wt % $B_2O_3$, 10.0 wt % to 16.0 wt % $TiO_2$ and the remainder $SiO_2$. In still another embodiment, the glass consists essentially of 3.0 wt % to 7.0 wt % $B_2O_3$, 10.0 wt % to 16.0 wt % $TiO_2$ and the remainder $SiO_2$. In still another embodiment, the glass consists essentially of 4.0 wt % to 7.0 wt % $B_2O_3$, 10.0 wt % to 16.0 wt % $TiO_2$ and the remainder $SiO_2$.

In one embodiment, the glass consists essentially of 0.1 wt % to 8.0 wt % $B_2O_3$, 11.0 wt % to 16.0 wt % $TiO_2$ and the remainder $SiO_2$. In another embodiment, the glass consists essentially of 0.5 wt % to 7.0 wt % $B_2O_3$, 11.0 wt % to 16.0 wt % $TiO_2$ and the remainder $SiO_2$. In still another embodiment, the glass consists essentially of 1.0 wt % to 7.0 wt % $B_2O_3$, 11.0 wt % to 16.0 wt % $TiO_2$ and the remainder $SiO_2$. In still another embodiment, the glass consists essentially of 2.0 wt % to 7.0 wt % $B_2O_3$, 11.0 wt % to 16.0 wt % $TiO_2$ and the remainder $SiO_2$. In still another embodiment, the glass consists essentially of 3.0 wt % to 7.0 wt % $B_2O_3$, 11.0 wt % to 16.0 wt % $TiO_2$ and the remainder $SiO_2$. In still another embodiment, the glass consists essentially of 4.0 wt % to 7.0 wt % $B_2O_3$, 11.0 wt % to 16.0 wt % $TiO_2$ and the remainder $SiO_2$.

The tuning of a titania-silica glass or doped titania-silica glass for optimal performance in a specified application depends on the conditions of the operating environment in which the glass will be used. A combination of adjustments in $TiO_2$ concentration and the fictive temperature $T_f$ provides control over the zero crossover temperature(s) and expansivity maximum of the glass to optimize performance for each application. A zero crossover temperature may also be referred to herein as a crossover temperature. A zero crossover temperature is a temperature at which the CTE of the glass is zero. When a glass has a CTE of zero, it neither expands nor contracts when heated or cooled.

Conventional titania-silica glass and doped titania-silica glasses typically have two crossover temperatures: a lower zero crossover temperature $T_{ZC1}$ and a higher crossover temperature $T_{ZC2}$. FIG. 1 schematically depicts the variation in expansivity with temperature for a typical titania-silica or doped titania-silica glass. $T_{ZC1}$ and $T_{ZC2}$ are depicted. The expansivity generally increases with increasing temperature to a maximum value and decreases with further increases in temperature. The maximum value of expansivity may also be referred to herein as the maximum value of CTE, peak CTE, or peak expansivity. $T_{ZC1}$ is the intercept of the rising portion of the expansivity curve and $T_{ZC2}$ is the intercept of the falling portion of the expansivity curve. The maximum expansivity (peak CTE) occurs at a temperature between $T_{ZC1}$ and $T_{ZC2}$. Expansivity slope at a particular temperature is the slope of the expansivity curve at that particular temperature. Expansivity (CTE) is normally expressed in units of ppb/K (or ppb/° C.) and expansivity slope (CTE slope) is normally expressed in units of $ppb/K^2$ (or $ppb/° C.^2$).

The optimum values of $T_{ZC1}$, $T_{ZC2}$, CTE slope, and maximum CTE depend on the application. The values can be controlled through variations in glass composition (e.g. $TiO_2$ concentration, $SiO_2$ concentration), dopant type (e.g. B), dopant concentration (e.g. $B_2O_3$ concentration), and annealing schedule (e.g. dwell time at elevated temperature, rate of cooling). $T_{ZC1}$ of undoped titania-silica glass can be controlled simply by adjusting the $TiO_2$ concentration of the glass. Slow annealing can be used to lower the expansivity slope and $T_{ZC2}$ of undoped titania-silica glass. If the application requires a generally constant expansivity (low expansivity slope) over a wide operational temperature range, it is necessary to design the glass to have a maximum CTE at a temperature within the desired operational range. When subjected to standard annealing conditions, undoped titania-silica glass has a maximum CTE at ~150° C. and provides a region of low expansivity slope only in the vicinity of that temperature. This temperature is too high for many applications (including for optics for EUVL systems and photomasks). To shift the temperature range over which the expansivity slope is low to a more convenient temperature, it is desirable to find a way to control $T_{ZC1}$ and $T_{ZC2}$. It is also desirable to reduce the maximum CTE to as close to zero as possible to promote dimensional stability of the glass over a wide temperature range.

Inclusion of boron as a dopant in titania-silica glass provides a mechanism for controlling $T_{ZC1}$, $T_{ZC2}$, CTE slope and maximum CTE. The boron-doped titania-silica glasses provide a temperature window of low expansivity slope at temperatures at or near room temperature. As a result, the glasses are particularly compatible with the requirements for substrates for EUVL masks and optics, which have an operational temperature range at and above room temperature. Since different components in an EUVL system are exposed to different temperature variations, and as EUVL system design and operation regimes depend on the evolution of developments in other areas such as system NA (numerical aperture), resist speed and source light intensity, no single combination of glass composition and $T_f$ is ideal for all situations. Manipulation of $T_{zc}$ over a wide temperature range, as is possible with the boron-doped titania-silica glasses disclosed herein, enables tuning of the material to the specific requirements in each case.

Structurally, the annealing cycle of the boron-doped titania-silica glasses is controlled to yield the desired fictive temperature(s) and glass structure(s). It has been found that while annealing alone can provide a structural improvement in undoped titania-silica glass that leads to an expansivity slope reduction of up to 40%, the inclusion of boron as a dopant, in an amount consistent with the present disclosure, provides for structural improvements that can lead to a CTE slope reduction in excess of 50%.

In one embodiment, the boron-doped titania-silica glass has an expansivity slope at 20° C. of less than 1 ppb/K². In another embodiment, the boron-doped titania-silica glass has an expansivity slope at 20° C. of less than 0.8 ppb/K². In another embodiment, the boron-doped titania-silica glass has an expansivity slope at 20° C. of less than 0.6 ppb/K².

In one embodiment, the boron-doped titania-silica glass has a fictive temperature ($T_f$) of less than 825° C. In another embodiment, the boron-doped titania-silica glass has a fictive temperature of less than 800° C. In still another embodiment, the boron-doped titania-silica glass has a fictive temperature of less than 775° C. In a further embodiment, the boron-doped titania-silica glass has a fictive temperature of less than 750° C.

The boron-doped titania-silica glass has two crossover temperatures within the typical operational temperature range for optics and photomasks in EUV lithography (including processes using 13.5 nm radiation). In one embodiment, $T_{ZC1}$ and $T_{ZC2}$ are in the range of 10° C. to 150° C. In another embodiment, $T_{ZC1}$ and $T_{ZC2}$ are in the range of 20° C. to 80° C. In still another embodiment, $T_{ZC1}$ and $T_{ZC2}$ are in the range of 20° C. to 60° C. In a further embodiment, $T_{ZC1}$ and $T_{ZC2}$ are in the range of 10° C. to 40° C. In an additional embodiment, $T_{ZC1}$ and $T_{ZC2}$ are in the range of 0° C. to 100° C. In further embodiments, for each temperature range specified herein for $T_{ZC1}$ and $T_{ZC2}$, the expansivity slope is substantially equal to zero at some temperature within the specified temperature range.

In one embodiment, the boron-doped titania-silica glass has an expansivity slope of 0±2 ppb/K² throughout the temperature range from $T_{ZC1}$ to $T_{ZC2}$. In one embodiment, the boron-doped titania-silica glass has an expansivity slope of 0±1.5 ppb/K² throughout the temperature range from $T_{ZC1}$ to $T_{ZC2}$. In one embodiment, the boron-doped titania-silica glass has an expansivity slope of 0±1 ppb/K² throughout the temperature range from $T_{ZC1}$ to $T_{ZC2}$. In one embodiment, the boron-doped titania-silica glass has an expansivity slope of 0±0.5 ppb/K² throughout the temperature range from $T_{ZC1}$ to $T_{ZC2}$. In one embodiment, the boron-doped titania-silica glass has an expansivity slope of 0±0.3 ppb/K² throughout the temperature range from $T_{ZC1}$ to $T_{ZC2}$.

In one embodiment, the peak CTE of the boron-doped titania-silica glass between $T_{ZC1}$ and $T_{ZC2}$ does not exceed 30 ppb/K. In another embodiment, the peak CTE of the boron-doped titania-silica glass between $T_{ZC1}$ and $T_{ZC2}$ does not exceed 20 ppb/K. In still another embodiment, the peak CTE of the boron-doped titania-silica glass between $T_{ZC1}$ and $T_{ZC2}$ does not exceed 10 ppb/K. In yet another embodiment, the peak CTE of the boron-doped titania-silica glass between $T_{ZC1}$ and $T_{ZC2}$ does not exceed 5 ppb/K. In still another embodiment, the peak CTE of the boron-doped titania-silica glass between $T_{ZC1}$ and $T_{ZC2}$ does not exceed 3 ppb/K.

The annealing cycle may also be controlled to provide a boron-doped titania-silica glass with a highly uniform spatial distribution of fictive temperature ($T_f$) and zero crossover temperature ($T_{zc}$) in the glass. One source of non-uniformity in fictive temperature is spatial variation in dopant concentration. The present annealing cycle provides excellent uniformity in fictive temperature and achieves high spatial uniformity of thermal expansion properties.

Variability of $T_f$, $T_{ZC1}$, and $T_{ZC2}$ can be defined based on calculations made from measurements averaged over a region of glass having a volume of at least 50 cm³, or at least 100 cm³, or at least 150 cm³, or at least 300 cm³, or at least 1000 cm³, or at least 1500 cm³, or at least 3000 cm³, or at least 5000 cm³, or at least 10,000 cm³, or at least 15,000 cm³, or at least 20,000 cm³, or at least 30,000 cm³, or at least 50,000 cm³. $T_f$, $T_{ZC1}$, and $T_{ZC2}$ have average values over a region of the glass having a volume of at least 50 cm³, or at least 100 cm³, or at least 150 cm³, or at least 300 cm³, or at least 1000 cm³, or at least 1500 cm³, or at least 3000 cm³, or at least 5000 cm³, or at least 10,000 cm³, or at least 15,000 cm³, or at least 20,000 cm³, or at least 30,000 cm³, or at least 50,000 cm³. As used herein, the average values of $T_f$, $T_{ZC1}$, and $T_{ZC2}$ refer, respectively, to the average obtained from measurements of $T_f$, $T_{ZC1}$, and $T_{ZC2}$ at 100 equally spaced points throughout the volume of the glass.

In one embodiment, $T_f$ varies from its average value by less than ±10° C. over a region of the glass having a volume of at least 100 cm³, or at least 300 cm³, or at least 1000 cm³, or at least 3000 cm³, or at least 10,000 cm³, or at least 20,000 cm³, or at least 50,000 cm³. In another embodiment, the variation in $T_f$ from its average value is less than ±5° C. over a region of the glass having a volume of at least 100 cm³, or at least 300 cm³, or at least 1000 cm³, or at least 3000 cm³, or at least 10,000 cm³, or at least 30,000 cm³. In still another embodiment, the variation in $T_f$ from its average value is less than ±2° C. over a region of the glass having a volume of at least 100 cm³, or at least 300 cm³, or at least 1000 cm³, or at least 3000 cm³, or at least 5000 cm³, or at least 10,000 cm³.

In one embodiment, the variation in $T_{ZC1}$ and $T_{ZC2}$ from their average values is less than ±5° C. over a region of the glass having a volume of at least 100 cm³, or at least 300 cm³, or at least 1000 cm³, or at least 3000 cm³, or at least 10,000 cm³, or at least 20,000 cm³, or at least 50,000 cm³. In another embodiment, the variation in $T_{ZC1}$ and $T_{ZC2}$ from their average values is less than ±3° C. over a region of the glass having a volume of at least 100 cm³, or at least 300 cm³, or at least 1000 cm³, or at least 3000 cm³, or at least 10,000 cm³, or at least 30,000 cm³. In still another embodiment, the variation in $T_{ZC1}$ and $T_{ZC2}$ from their average values is less than ±1° C. over a region of the glass having a volume of at least 50 cm³, or at least 150 cm³, or at least 500 cm³, or at least 1500 cm³, or at least 5000 cm³, or at least 15,000 cm³.

Preparation of the boron-doped titania-silica glass is not limited to a particular process. The glass can be made by many preparation techniques including, but not limited to, sol-gel, soot blank, soot pressing, pyrolysis, outside vapor deposition, axial vapor deposition, the direct process, the indirect process, plasma process, chemical vapor deposition, and other processes known in the art. Boron doping can be accomplished in many ways, such as by adding a boron precursor to a sol-gel slurry before gelation or spray drying, during laydown in an OVD/AVD process or the direct process or by providing a boron precursor during consolidation. A boron doped titania-silica soot can also be prepared by flame hydrolysis or oxidation of mixed vapors of B, Ti and Si precursors. This soot can then be shaped in to an article by axial pressing or cold isostatic pressing and can be consolidated by heat treatment or hot isostatic pressing.

Among the method for forming the soot blank are:

(1) The OVD (outside vapor deposition) process, in which soot is made in a burner by the combustion of a silica precursor, a titania precursor, boron precursor and an optional oxide precursor(s) and the soot is collected on a mandrel. Alternatively, the boron precursor may be excluded from the combustion process and provided during consolidation to form a boron-doped titania-silica glass with optional additional oxide components. A halogen precursor may also be provided during consolidation to provide e.g. fluorine.

(2) Soot pressing of a soot made by the combustion of a silica precursor, a titania precursor, and a boron precursor in a burner. Additional alkali metal precursors may also be provided to the burner. Alternatively, the boron precursor (and other precursors (e.g. halogen precursors) may be provided during the consolidation phase instead of being included during the combustion phase.

(3) A sol-gel process in which titania-silica soot is made into a sol using a solvent in which a boron precursor is dissolved and formed into a shape by gelation of the sol and dried to form porous boron doped titania-silica articles that are then consolidated. Additional optional alkali metal or other precursors may be added to the sol-gel before it is formed into a shape, dried and consolidated. Consolidation may be carried out in air or an air-inert gas mixture. In another embodiment the soot used in the sol-gel process is one in which the additional oxide precursors are added during the formation of the silica-titania soot as described above in Item (2). The boron precursor may alternatively be provided during the sol phase of the preparation and may participate in the gelation reaction to form a porous boro-titania-silica article.

In embodiments of the boron-doped titania-silica glass that include fluorine incorporation, the fluorine can be provided during consolidation via a gas such as $F_2$, $CF_4$, $SF_4$, $SiF_4$ or other volatile fluorine compounds that may be mixed with a carrier gas (e.g. air, $N_2$, an inert gas). When compounds such as $CF_4$ and $SF_4$ are used as the fluorinating agent, it is preferable to use a carrier gas that includes oxygen gas in order to convert the non-fluorine portion of the fluorinating agent (C, Si or S) to a volatile species, for example $CO_2$, SiO or $SO_2$, which is swept out of the system by the carrier gas. It is important to include $O_2$ as part of the carrier gas to limit the reduction of $Ti^{4+}$ to $Ti^{3+}$. $Ti^{3+}$ has been found to reduce the transmittance of the glass as well as to increase the CTE of the glass.

The consolidation temperature will depend on the method of soot blank preparation and can vary from 1300° C. for an OVD process to 1670° C. for other processes such as soot pressing and sol-gel.

The glass may be annealed after consolidation. Annealing of the consolidated composition may include heating for at least one hour at an elevated temperature of at least 850° C., or at least 900° C., or at least 950° C., or at least 1000° C. After heating at the elevated temperature, the glass may be cooled at a rate between 0.1° C./hr and 30° C./hr, or between 0.2° C./hr and 20° C./hr, or between 0.3° C./hr and 10° C./hr, or between 0.3° C./hr and 5° C./hr, or between 0.1° C./hr and 5° C./hr, or between 0.1° C./hr and 3° C./hr, or between 0.1° C./hr and 1.5° C./hr to a temperature below 750° C., or below 700° C., or below 650° C.

The glass may optionally be heated after consolidation before annealing. In one embodiment, the glass is heated to a temperature of at least 1500° C. for at least 5 minutes. Heating after consolidation may induce melting of crystalline regions, if present, in the consolidated glass.

Examples

In this example, the CTE slope of boron-doped titania-silica glass is compared with the CTE slope of standard titania-silica glass. The standard titania-silica glass was commercial ULE® 7973 glass from Corning, Inc. The ULE® 7973 glass had the composition 7.4 wt % $TiO_2$-92.6 wt % $SiO_2$. A series of boron-doped titania-silica glass samples were prepared using the sol-gel method. Samples with $B_2O_3$ concentrations of 0.26 wt %, 0.35 wt %, 1.1 wt %, 3 wt %, 4.5 wt %, and 6.0 wt % were prepared. The compositions of the samples are summarized in Table 1. Hydroxyl (OH) concentration of Samples 1-4 was measured using FTIR. The OH concentration was in the general range from 35 ppm (Sample 4) to 120 ppm (Sample 1).

TABLE I

| Sample | $B_2O_3$ (wt %) | $TiO_2$ (wt %) | $SiO_2$ (wt %) |
|---|---|---|---|
| ULE ® 7973 | 0 | 7.40 | 92.60 |
| 1 | 0.26 | 7.35 | 92.39 |
| 2 | 0.35 | 7.25 | 92.40 |
| 3 | 1.07 | 7.13 | 91.80 |
| 4 | 2.98 | 6.74 | 90.28 |
| 5 | 4.30 | 6.96 | 88.74 |
| 6 | 6.25 | 6.37 | 87.38 |

Boron doping was accomplished during the sol preparation step of the sol-gel method, by dissolving a boron precursor (boric acid) in the solvent. Titania-silica soot having a composition 7.4 wt % $TiO_2$-92.6 wt % $SiO_2$ was then mixed with the above solution to form the sol, which was then gelled, after overnight mixing, by addition of a pH reducing agent, such as 1-chloro 2-propanol. Alternatively, the boron precursor can be dissolved in DI water and then the titania-silica soot (7.4 wt % $TiO_2$, 92.6 wt % $SiO_2$) is then mixed in the solution to form a slurry. Boron-doped titania-silica glass was prepared by spray-drying the slurry and pressing the resulting doped soot.

Boron doping can alternatively be accomplished in the direct or indirect process. The consolidation temperature for non-direct processes will be around 1670° C. The consolidation temperature for the OVD process would be around 1350-1400° C. The sol-gel or soot pressed samples need to be dried at 120° C. and pre-sintered at 800° C. before consolidation. The consolidated glass samples were annealed by heating to 1050° C., holding at 1050° C. for 1 hour, cooling from 1050° C. to 700° C. at the rate of 3° C. per hour, and cooling from 700° C. to room temperature naturally. As used herein, natural cooling refers to turning off the heat source and allowing the glass to cool to room temperature at the cooling rate of the furnace.

Further details of the preparations of Sample 3 and Sample 4 are given below. All other Samples were prepared similarly.

Preparation of Sample 3

Titania-silica soot particles were made by oxidation of OMCTS (octamethylcyclotetrasiloxane, (—Si$(CH_3)_2$O—$)_4$)

and TPT (tetraisopropyltitanate, $Ti(OC_3H_7)_4$) in a natural gas-oxygen flame and were collected. The soot composition was 7.4 wt % $TiO_2$-92.6 wt % $SiO_2$ and the soot had a surface area of about 25 $m^2/g$. A boron precursor, boric acid, was dissolved in an aqueous TMAH (tetramethylammonium hydroxide (($CH_3)_4$NOH)) solvent and mixed with the titania-silica soot to form a sol. Boric acid can be replaced by ammonium pentaborate tetrahydrate, which has a higher solubility in water, if needed. The boric acid content of the sol was set to provide a consolidated sample having a boron doping level of 1.0 wt %. The sol was gelled by adjusting the pH. The gelled blanks were dried at 120° C. and pre-sintered at 800° C. to remove organics. The pre-sintered blanks were consolidated at 1670° C. in flowing He. The consolidated glass discs were annealed by heating to 1050° C. for 1 hour and then cooling to 700° C. at 3° C./h to achieve a fictive temperature below 900° C. The samples were cooled naturally to room temperature.

Preparation of Sample 4

Titania-silica soot particles were made by oxidation of OMCTS (octamethylcyclotetrasiloxane, ($-Si(CH_3)_2O-)_4$) and TPT (tetraisopropyltitanate, $Ti(OC_3H_7)_4$) in a natural gas-oxygen flame and were collected. The soot composition was 7.4 wt % $TiO_2$-92.6 wt % $SiO_2$ and the soot had a surface area of about 25 $m^2/g$. A boron precursor, boric acid, was dissolved in an aqueous TMAH (tetramethylammonium hydroxide (($CH_3)_4$NOH)) solvent and mixed with the titania-silica soot to form a sol. Boric acid can be replaced by ammonium pentaborate tetrahydrate, which has a higher solubility in water, if needed. The boric acid content of the sol was set to provide a consolidated sample having a boron doping level of 3.0 wt %. The sol was gelled by adjusting the pH. The gelled blanks were dried at 120° C. and pre-sintered at 800° C. to remove organics. The pre-sintered blanks were consolidated at 1670° C. in flowing He. The consolidated glass discs were annealed by heating to 1050° C. for 1 hour and then cooling to 700° C. at 3° C./h to achieve a fictive temperature below 800° C. The samples were cooled naturally to room temperature.

CTE Slope Measurements

CTE slope was measured using the sandwich seal technique. The boron-doped titania-silica glass samples were polished and assembled into sandwich seals with conventional ULE® 7973 glass. The ULE® 7973 glass has a known CTE slope (1.60 ppb/$K^2$) and serves as a reference in the measurement. A piece of ULE® 7973 glass was inserted between two pieces of boron-doped titania-silica glass to form the sandwich seal. In each measurement, the two pieces of boron-doped titania-silica glass had the same boron concentration and were drawn from the same sample. The sandwich seal pieces were of approximate dimensions 1.25"×1"×⅛". The stress on the central ULE® 7973 piece exerted by the two surrounding boron-doped titania-silica pieces was measured as the sandwich was heated from −50° C. to +150° C. The difference in the CTE slope between the surrounding boron-doped titania-silica pieces and the central ULE® 7973 piece was determined from the measured stress. Since the CTE slope of ULE® 7973 glass was known, the CTE slope of the boron-doped titania-silica glasses could be determined. The experiment was repeated for boron-doped titania-silica glasses differing in boron doping concentration.

The following CTE slope values were obtained at 20° C.:

TABLE II

| Sample | $TiO_2$ (wt %) | $SiO_2$ (wt %) | $B_2O_3$ (wt %) | CTE Slope at 20° C. (ppb/$K^2$) |
|---|---|---|---|---|
| ULE ® 7973 | 7.40 | 92.60 | 0 | 1.60 |
| 1 | 7.35 | 92.39 | 0.26 | 1.88 |
| 2 | 7.25 | 92.40 | 0.35 | 1.82 |
| 3 | 7.13 | 91.80 | 1.07 | 1.64 |
| 4 | 6.74 | 90.28 | 2.98 | 1.02 |
| 5 | 6.96 | 88.74 | 4.30 | 0.62 |
| 6 | 6.37 | 87.38 | 6.25 | −0.14 |
| 10 | 6.41 | 89.08 | 4.51 | 0.10 |
| 11 | 6.42 | 89.18 | 4.40 | 0.28 |
| 12 | 8.97 | 90.33 | 0.70 | 1.60 |
| 13 | 8.70 | 89.90 | 1.40 | 1.24 |
| 14 | 5.21 | 93.71 | 1.08 | 1.56 |
| 15 | 4.25 | 93.22 | 2.53 | 0.94 |
| 16 | 10.70 | 88.38 | 0.92 | 1.53 |
| 17 | 4.36 | 93.59 | 2.05 | 1.16 |
| 18 | 3.90 | 91.10 | 5.0 | 0.096 |
| 19 | 11.10 | 88.90 | 0 | 1.93 |

Figure 2:
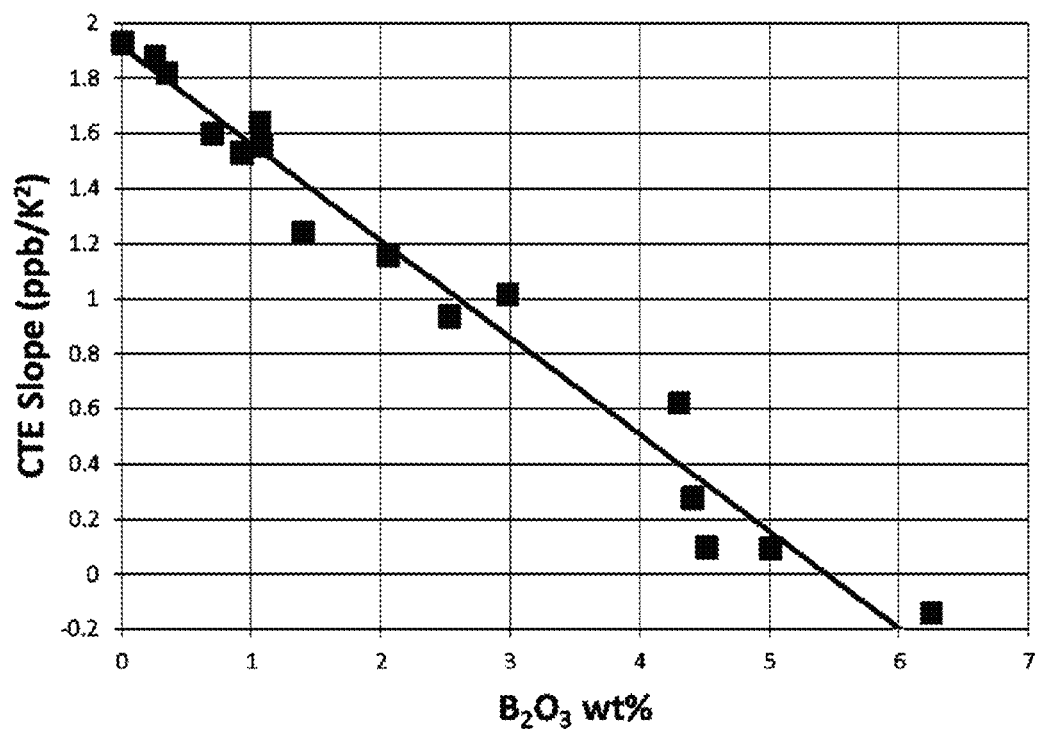
FIG. 2 is a graph of CTE slope at 20° C. as a function of boron doping concentration (expressed as wt % $B_2O_3$) for titania-silica glass (ULE® 7973) and several boron-doped titania-silica glasses with differing boron concentrations.

The dependence of CTE slope at 20° C. on boron doping concentration (expressed as wt % $B_2O_3$) for the Samples listed in Table 2 is shown graphically in FIG. 2. The CTE slope of ULE® 7973 is shown at a boron doping concentration of 0 wt % for comparison. The graph shows that the CTE slope decreases with increasing boron doping concentration and that CTE slopes below the CTE slope of ULE® 7973 are expected for boron doping concentrations above about 1.0 wt %. In the boron concentration range investigated, CTE slope was observed to decrease by ~0.35 ppb/$K^2$ for each increase in $B_2O_3$ concentration of 1.0 wt %. Additional reductions in CTE slope are expected if the cooling rate used in the annealing process is less than the 3° C./h rate used for these samples.

Figure 3:
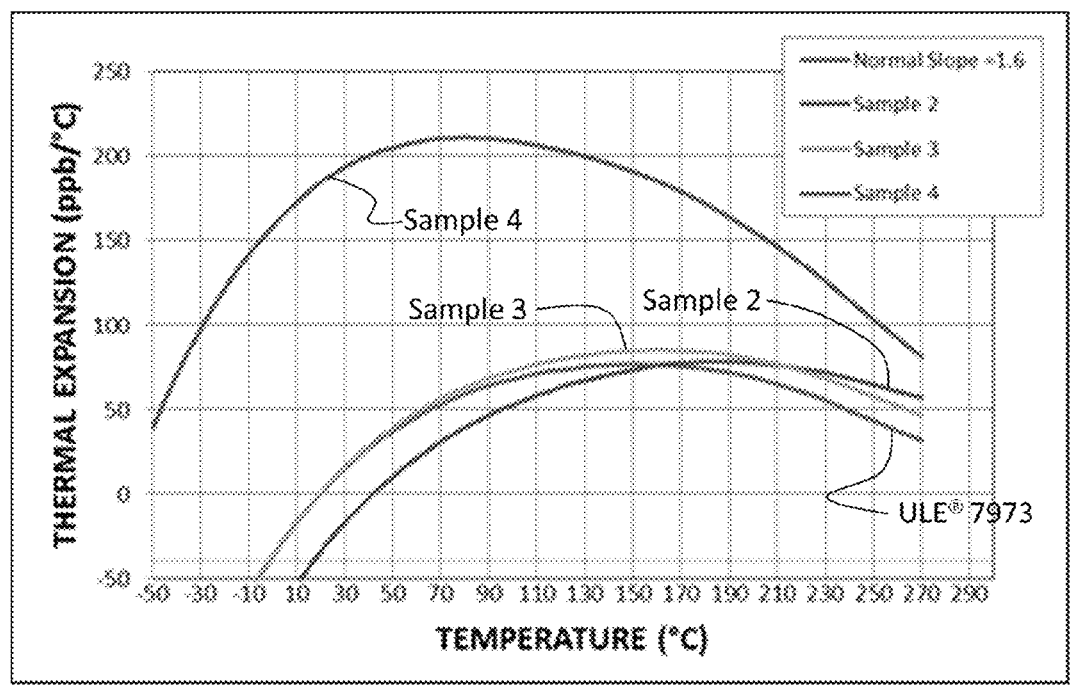
FIG. 3 is a graph of CTE as a function of temperature for ULE® 7973 glass and three boron-doped titania-silica glasses with differing boron concentrations.

FIG. 3 shows the dependence of thermal expansion coefficient (CTE) on temperature derived from the sandwich seal data for ULE® 7973 glass and Samples 2-4. $T_{ZC1}$, and CTE at 20° C. can be obtained from the graph. $T_{ZC2}$ can be obtained from extrapolations of the CTE curves shown in FIG. 1. The same procedure can be used to determine $T_{ZC1}$, $T_{ZC2}$, and CTE at 20° C. for Sample 1. The resulting values are summarized in Table III:

TABLE III

| Sample | $T_{ZC1}$ (° C.) | $T_{ZC2}$ (° C.) | CTE at 20° C. (ppb/K) |
|---|---|---|---|
| ULE ® 7973 | 20 | >300 | 0 |
| 1 | 52 | >300 | −48.1 |
| 2 | 46 | >300 | −39.9 |
| 3 | 21 | >300 | −1.9 |
| 4 | −70 | >300 | 194.1 |

For many applications, it is desirable for $T_{ZC1}$ to be at or slightly above room temperature. The temperature $T_{ZC1}$ can be controlled by varying the $TiO_2$ content of the boron-doped titania-silica glasses. The general trend is that $T_{ZC1}$ increases with increasing $TiO_2$ content and decreases with decreasing $TiO_2$ content. The $TiO_2$ content of Samples 1-4 can be adjusted at constant $B_2O_3$ content to provide glasses with $T_{ZC1}$=20° C. The necessary adjustments are summarized in Table IV. Samples 1a-4a correspond to modified forms of Samples 1-4, respectively, that include the same $B_2O_3$ content, have the same CTE slope at 20° C., and a $TiO_2$ content that has been adjusted to shift $T_{ZC1}$ to 20° C. Since the balance of the glass composition is $SiO_2$, adjustments in $TiO_2$ content at constant $B_2O_3$ content are compensated by changes in $SiO_2$ content. The reported properties are based on standard annealing conditions (heating to 1050° C., holding at 1050° C. for 1 hour, cooling from 1050° C. to 700° C. at the rate of 3° C. per hour, and cooling from 700° C. to room temperature naturally).

TABLE IV

| Sample | $TiO_2$ (wt %) | $SiO_2$ (wt %) | $B_2O_3$ (wt %) | CTE Slope at 20° C. (ppb/K$^2$) | $T_{ZC1}$ (° C.) | $T_{ZC2}$ (° C.) |
|---|---|---|---|---|---|---|
| ULE ® 7973 | 7.40 | 92.60 | 0 | 1.60 | 20 | >300 |
| 1a | 6.75 | 92.99 | 0.26 | 1.90 | 20 | >300 |
| 2a | 6.75 | 92.90 | 0.35 | 1.84 | 20 | >300 |
| 3a | 7.11 | 91.82 | 1.07 | 1.66 | 20 | >300 |
| 4a | 9.17 | 87.85 | 2.98 | 1.06 | 20 | 160 |

Figure 4:
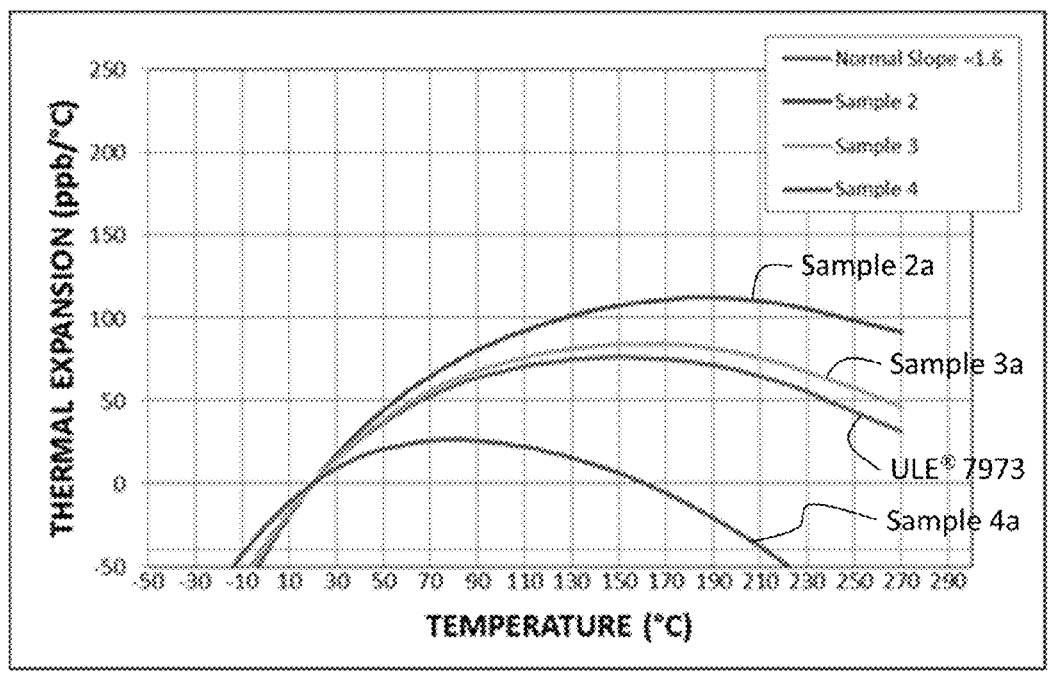
FIG. 4 is a graph of CTE as a function of temperature for ULE® 7973 glass and three boron-doped titania-silica glasses having the $B_2O_3$ content of the glasses of FIG. 3 and $TiO_2$ content adjusted to provide $T_{ZC1}$=20° C.

FIG. 4 shows calculated curves of CTE as a function of temperature for ULE® 7973 glass and Samples 2a-4a. The results indicate that the increase in $TiO_2$ content for Sample 4a (from 6.74 wt % in Sample 4 to 9.17 wt % in Sample 4a at constant 2.98 wt % $B_2O_3$) further results in a decrease in $T_{ZC2}$ to −160° C., which is a more favorable value for EUVL applications than the value of >300° C. observed in Sample 4. $T_{ZC2}$ of Samples 2a and 3a, which have low $B_2O_3$ content, remains high when the $TiO_2$ content of Samples 2 and 3 is adjusted to provide $T_{ZC1}$=20° C. The lower $B_2O_3$ content samples (2a and 3a) also show a higher peak CTE over the temperature range indicated than the higher $B_2O_3$ sample (4a).

Table V indicates adjustments in $TiO_2$ concentration that provide $T_{ZC1}$=30° C. for samples having the $B_2O_3$ content and CTE slope at 20° C. of ULE® 7973 and Samples 1-4. The modified samples are labeled ULE® 7973b and Samples 1b-4b to correspond, respectively, to ULE® 7973 and Samples 1-4 (and Samples 1a-4a) having the same $B_2O_3$ content and same CTE slope at 20° C. The reported properties are based on standard annealing conditions (heating to 1050° C., holding at 1050° C. for 1 hour, cooling from 1050° C. to 700° C. at the rate of 3° C. per hour, and cooling from 700° C. to room temperature naturally).

TABLE V

| Sample | $TiO_2$ (wt %) | $SiO_2$ (wt %) | $B_2O_3$ (wt %) | $T_{ZC1}$ (° C.) | CTE at 20° C. (ppb/K) | CTE Slope at 20° C. (ppb/K$^2$) |
|---|---|---|---|---|---|---|
| ULE ® 7973b | 7.58 | 92.42 | 0 | 30 | −14.5 | 1.60 |
| 1b | 6.97 | 92.77 | 0.26 | 30 | −17.5 | 1.90 |
| 2b | 6.96 | 92.69 | 0.35 | 30 | −16.9 | 1.84 |
| 3b | 7.30 | 91.63 | 1.07 | 30 | −15.1 | 1.66 |
| 4b | 9.28 | 87.74 | 2.98 | 30 | −9.1 | 1.06 |

Figure 5:
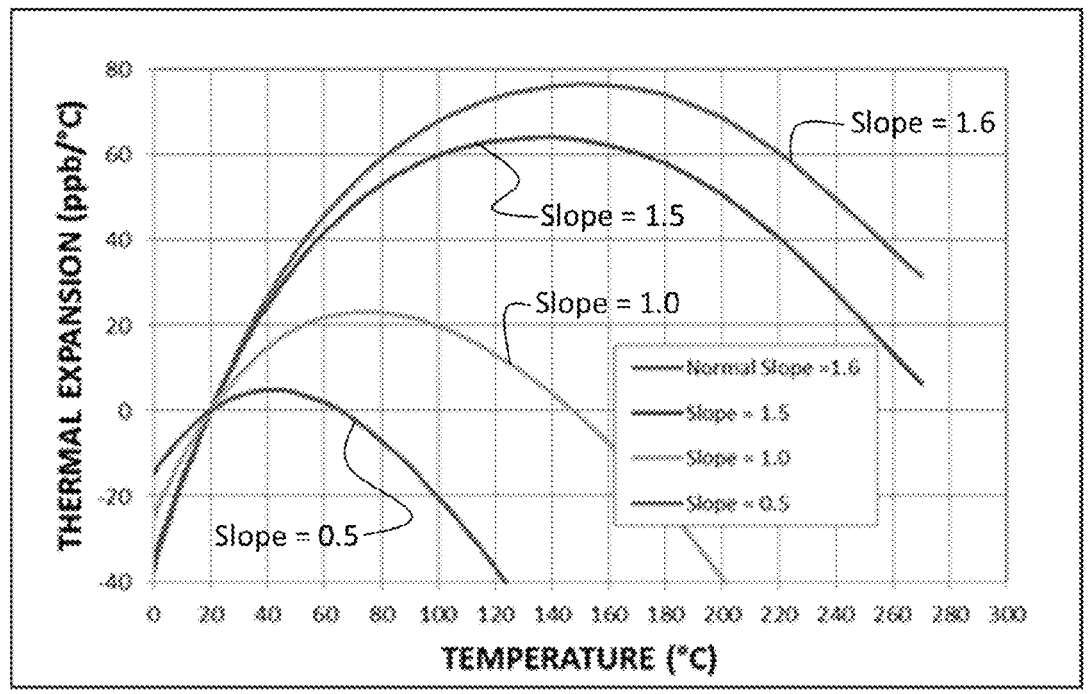
FIG. 5 is a graph of CTE as a function of temperature for ULE® 7973 glass (CTE Slope=1.6 ppb/$K^2$) and three boron-doped titania-silica glasses having $T_{ZC1}$=20° C. and CTE Slopes of 1.5 ppb/$K^2$, 1.0 ppb/$K^2$, and 0.5 ppb/$K^2$.

Variations in the $B_2O_3$ content of the glasses lead to changes in CTE slope at 20° C. and $T_{ZC1}$. The general trend is that increases in $B_2O_3$ content lead to a reduction in CTE slope at 20° C. and a reduction in $T_{ZC1}$. Changes in $T_{ZC1}$ induced by varying the $B_2O_3$ content can be offset by a compensating change in $TiO_2$ content. Table VI lists the calculated compositions of glasses having $T_{ZC1}$=20° C. and CTE slopes at 20° C. of 0.50 ppb/K, 1.0 ppb/K, and 1.5 ppb/K. ULE® 7973 glass is provided as a comparison. The reported properties are based on standard annealing conditions (heating to 1050° C., holding at 1050° C. for 1 hour, cooling from 1050° C. to 700° C. at the rate of 3° C. per hour, and cooling from 700° C. to room temperature naturally). FIG. 5 shows the calculated CTE curves for the glasses listed in Table VI. The CTE curves are labeled with the CTE slope at 20° C. of the glasses.

TABLE VI

| Sample | $B_2O_3$ (wt %) | $TiO_2$ (wt %) | $SiO_2$ (wt %) | CTE Slope at 20° C. (ppb/K$^2$) | $T_{ZC1}$ (° C.) | $T_{ZC2}$ (° C.) |
|---|---|---|---|---|---|---|
| ULE ® 7973 | 0 | 7.40 | 92.60 | 1.60 | 20 | >300 |
| 7 | 1.19 | 8.42 | 90.39 | 1.50 | 20 | 280 |
| 8 | 2.61 | 10.56 | 86.83 | 1.00 | 20 | 148 |
| 9 | 4.03 | 12.71 | 83.26 | 0.50 | 20 | 65 |

The data in Table VI indicate that increases in $TiO_2$ content of the glass are required to maintain $T_{ZC1}$=20° C. as the $B_2O_3$ concentration increases. Increasing $B_2O_3$ concentration leads to a decrease in CTE slope at 20° C. and a decrease in $T_{ZC2}$. FIG. 5 indicates that the peak CTE value (maximum of the CTE curve) decreases with decreasing CTE slope (increasing $B_2O_3$ concentration). The data show that judicious control of the combination of $TiO_2$ content and $B_2O_3$ content provide glasses with $T_{ZC1}$ fixed at 20° C. and systematically decreasing $T_{ZC2}$ and peak CTE values.

Further demonstration of the independent control of $T_{ZC1}$ and $T_{ZC2}$ available from proper combinations of the concentrations of $TiO_2$ and $B_2O_3$ is shown in Tables VII-IX, which shows modifications of Samples 7, 8, and 9 that contain varying $TiO_2$ concentrations. The modifications of Samples 7, 8, and 9, are labeled Samples 7a-7c, 8a-8c, and 9a-9c, respectively. The modified samples have the same $B_2O_3$ concentration and same CTE slope at 20° C. as the corresponding unmodified samples. Table VII lists the values of $T_{ZC1}$, $T_{ZC2}$, and peak CTE for each of the samples. The reported properties are based on standard annealing conditions (heating to 1050° C., holding at 1050° C. for 1 hour, cooling from 1050° C. to 700° C. at the rate of 3° C. per hour, and cooling from 700° C. to room temperature naturally), and low OH content (~50 ppm).

TABLE VII

| Sample | $B_2O_3$ (wt %) | $TiO_2$ (wt %) | $SiO_2$ (wt %) | CTE Slope at 20° C. (ppb/$K^2$) | $T_{ZC1}$ (° C.) | $T_{ZC2}$ (° C.) | CTE Peak (ppb/K) |
|---|---|---|---|---|---|---|---|
| 7  | 1.19 | 8.42 | 90.39 | 1.50 | 20 | 280 | 64 |
| 7a | 1.19 | 8.50 | 90.31 | 1.50 | 25 | 270 | 57 |
| 7b | 1.19 | 8.58 | 90.23 | 1.50 | 30 | 260 | 51 |
| 7c | 1.19 | 8.73 | 90.08 | 1.50 | 40 | 245 | 40 |

TABLE VIII

| Sample | $B_2O_3$ (wt %) | $TiO_2$ (wt %) | $SiO_2$ (wt %) | CTE Slope at 20° C. (ppb/$K^2$) | $T_{ZC1}$ (° C.) | $T_{ZC2}$ (° C.) | CTE Peak (ppb/K) |
|---|---|---|---|---|---|---|---|
| 8  | 2.61 | 10.56 | 86.83 | 1.00 | 20 | 148 | 23 |
| 8a | 2.61 | 10.62 | 86.77 | 1.00 | 25 | 140 | 19 |
| 8b | 2.61 | 10.67 | 86.72 | 1.00 | 30 | 129 | 15 |
| 8c | 2.61 | 10.75 | 86.64 | 1.00 | 40 | 115 | 8.5 |

TABLE IX

| Sample | $B_2O_3$ (wt %) | $TiO_2$ (wt %) | $SiO_2$ (wt %) | CTE Slope at 20° C. (ppb/$K^2$) | $T_{ZC1}$ (° C.) | $T_{ZC2}$ (° C.) | CTE Peak (ppb/K) |
|---|---|---|---|---|---|---|---|
| 9a | 4.03 | 12.68 | 83.29 | 0.50 | 15 | 72 | 7.5 |
| 9  | 4.03 | 12.71 | 83.26 | 0.50 | 20 | 65 | 4.9 |
| 9b | 4.03 | 12.74 | 83.23 | 0.50 | 25 | 60 | 2.7 |
| 9c | 4.03 | 12.76 | 83.21 | 0.50 | 30 | 53 | 1.4 |

Figure 6:
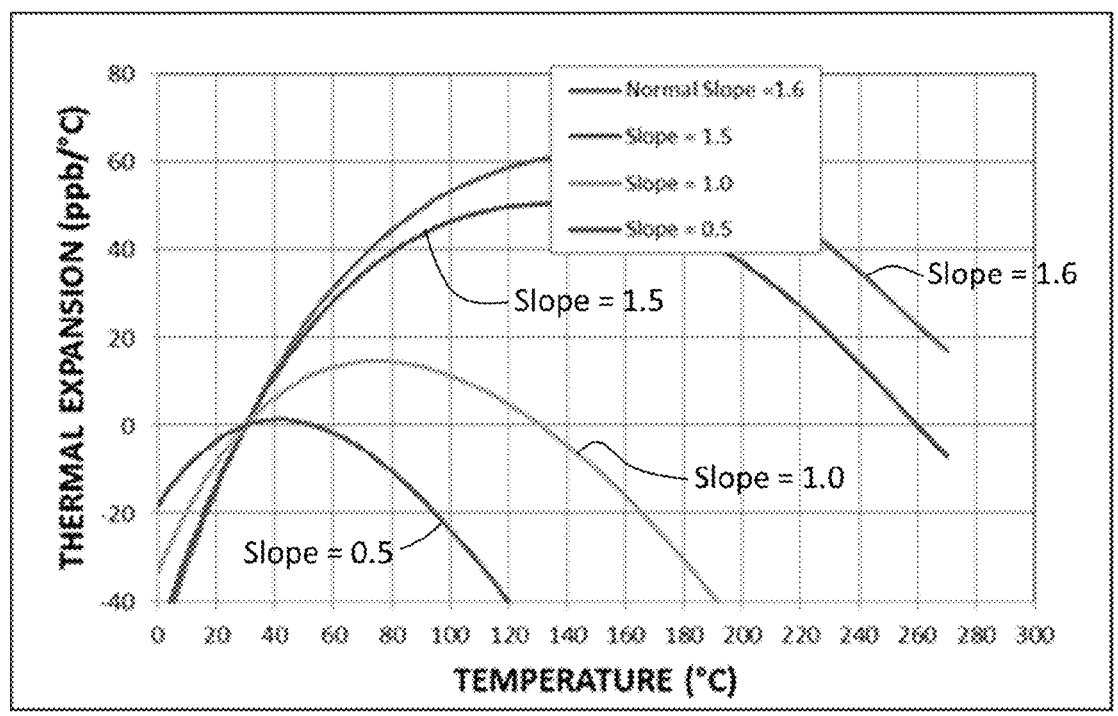
FIG. 6 is a graph of CTE as a function of temperature for ULE® 7973 glass (CTE Slope=1.6 ppb/$K^2$) and three boron-doped titania-silica glasses having $T_{ZC1}$=30° C. and CTE Slopes of 1.5 ppb/$K^2$, 1.0 ppb/$K^2$, and 0.5 ppb/$K^2$.

FIG. 6 shows the calculated CTE curves of a series of samples having $T_{ZC1}$=30° C. (ULE® 7973b, Sample 7b, Sample 8b, and Sample 9c). The CTE curves are labeled according to the CTE slope (in units of ppb/$K^2$) at 20° C. for each sample: Slope=1.6 ppb/$K^2$ (ULE® 7973b), Slope=1.5 ppb/$K^2$ (Sample 7b), Slope=1.0 ppb/$K^2$ (Sample 8b), and Slope=0.5 ppb/$K^2$ (Sample 9c).

The results show wide latitude in controlling $T_{ZC1}$, $T_{ZC2}$, CTE slope at 20° C., and CTE peak through variations in the concentrations of $TiO_2$ and $B_2O_3$ in the glasses. Of particular interest for EUVL applications is the ability to adjust the composition of the glass to achieve near-zero thermal expansion in the temperature range at and slightly above room temperature. The CTE curve for Sample 9c, for example, exhibits $T_{ZC1}$=30° C., $T_{ZC2}$=53° C., CTE peak=1.4 ppb/K and a temperature of ~40° C. over which CTE varies between ±2 ppb/K.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A glass comprising 0.1 wt % to 8.0 wt % $B_2O_3$, 9.0 wt % to 16.0 wt % $TiO_2$, and 76.0 wt % to 90.9 wt % $SiO_2$, said glass having an expansivity slope less than 1 ppb/$K^2$ at 20° C.

2. The glass of claim 1, wherein said glass has an expansivity slope less than 0.6 ppb/$K^2$ at 20° C.

3. The glass of claim 1, wherein the glass has a first crossover temperature and a second crossover temperature, said second crossover temperature being higher than said first crossover temperature, said first crossover temperature and said second crossover temperature occurring between 10° C. and 150° C., said glass having an expansivity slope of 0±1.5 ppb/$K^2$ at all temperatures between said first crossover temperature and said second crossover temperature, said glass having a maximum expansivity of less than 30 ppb/K between said first crossover temperature and said second crossover temperature.

4. The glass of claim 3, wherein said first crossover temperature and said second crossover temperature occur between 20° C. and 60° C., said glass having an expansivity slope of 0±0.5 ppb/$K^2$ at all temperatures between said first crossover temperature and said second crossover temperature, said glass having a maximum expansivity of less than or equal to 10 ppb/K between said first crossover temperature and said second crossover temperature.

5. The glass of claim 3, wherein said first crossover temperature has a first average value over a region of said glass having a volume of at least 300 $cm^3$, said first crossover temperature varying from said first average value by less than ±3° C. over said region, and said second crossover temperature has a second average value over said region, said second crossover temperature varying from said second average value by less than ±3° C. over said region.

6. The glass of claim 1, wherein said glass has a fictive temperature less than 775° C.

7. The glass of claim 1, wherein said glass comprises 3.0 wt % to 7.0 wt % $B_2O_3$ and 77.0 wt % to 88.0 wt % $SiO_2$.

8. The glass of claim 1, wherein said glass comprises 10.0 wt % to 16.0 wt % $TiO_2$ and 76.0 wt % to 89.9 wt % $SiO_2$.

9. The glass of claim 8, wherein said glass comprises 3.0 wt % to 7.0 wt % $B_2O_3$ and 77.0 wt % to 87.0 wt % $SiO_2$.

10. The glass of claim 1, further comprising up to 0.4 wt % combined of one or more of F, $Nb_2O_5$, $Ta_2O_5$, $Al_2O_3$, $Li_2O$, $Na_2O$, $K_2O$, MgO, and CaO.

11. The glass of claim 1, wherein said glass further comprises at least 300 ppm OH.

12. The glass of claim 1, further comprising 50 ppm-wt to 0.4 wt % of one of F, $Nb_2O_5$, $Ta_2O_5$, $Al_2O_3$, $Li_2O$, $Na_2O$, $K_2O$, MgO, and CaO.

13. The glass of claim 1, further comprising two or more of F, $Nb_2O_5$, $Ta_2O_5$, $Al_2O_3$, $Li_2O$, $Na_2O$, $K_2O$, MgO, and CaO at a combined concentration of 50 ppm-wt to 0.4 wt %.

14. The glass of claim 1, wherein said glass further comprises at least 600 ppm OH.

15. The glass of claim 1, wherein said glass further comprises at least 800 ppm OH.

16. A glass consisting essentially of 0.1 wt % to 8.0 wt % $B_2O_3$, 9.0 wt % to 16.0 wt % $TiO_2$, and the remainder $SiO_2$, said glass having an expansivity slope at 20° C. less than 0.8 ppb/$K^2$.

17. The glass of claim 16, wherein the glass has a first crossover temperature and a second crossover temperature, said second crossover temperature being higher than said first crossover temperature, said first crossover temperature and said second crossover temperature occurring between 10° C. and 150° C., said glass having an expansivity slope of 0±1.5 ppb/K$^2$ at all temperatures between said first crossover temperature and said second crossover temperature said glass having a maximum expansivity of less than 30 ppb/K between said first crossover temperature and said second crossover temperature.

18. The glass of claim 17, wherein said first crossover temperature and said second crossover temperature occur between 20° C. and 60° C., said glass having an expansivity slope of 0±0.5 ppb/K$^2$ at all temperatures between said first crossover temperature and said second crossover temperature, said glass having a maximum expansivity of less than or equal to 10 ppb/K between said first crossover temperature and said second crossover temperature.

19. The glass of claim 16, wherein said glass has a fictive temperature less than 775° C.

20. The glass of claim 16, wherein said glass consists essentially of 3.0 wt % to 7.0 wt % $B_2O_3$, 9.0 wt % to 16.0 wt % $TiO_2$, and the remainder $SiO_2$.

* * * * *